United States Patent [19]

Lischke

[11] Patent Number: 4,996,441

[45] Date of Patent: Feb. 26, 1991

[54] LITHOGRAPHIC APPARATUS FOR STRUCTURING A SUBJECT

[75] Inventor: Burkard Lischke, Munich, Fed. Rep. of Germany

[73] Assignee: Siemens Aktiengesellschaft, Berlin and Munich, Fed. Rep. of Germany

[21] Appl. No.: 395,976

[22] Filed: Aug. 21, 1989

[30] Foreign Application Priority Data

Sep. 16, 1988 [DE] Fed. Rep. of Germany ....... 3831526

[51] Int. Cl.[5] .......................................... H01V 37/317
[52] U.S. Cl. .................................. 250/492.2; 250/398
[58] Field of Search ........... 250/492.2, 492.22, 492.23, 250/492.3, 398

[56] References Cited

U.S. PATENT DOCUMENTS

| 4,130,761 | 12/1978 | Matsuda | 250/492.2 |
|---|---|---|---|
| 4,153,843 | 5/1979 | Pease | 250/492.2 |
| 4,405,487 | 10/1983 | Kuschel et al. | 250/398 |
| 4,418,283 | 11/1983 | Trotel | 250/492.2 |
| 4,524,278 | 6/1985 | Le Poole | 250/398 |
| 4,724,328 | 2/1988 | Lischke | 250/492.2 |
| 4,847,552 | 1/1990 | Okunuki et al. | 250/492.2 |

FOREIGN PATENT DOCUMENTS

0191439A1 8/1986 European Pat. Off. .

OTHER PUBLICATIONS van Gorkom et al., "Silicon Cold Cathodes as Possible Sources in Electron Lithography Systems", *J. Vac. Sci. Technol.*, A5(4), Jul./Aug. 1987, pp. 1544–1548.

May et al., "Picosecond Photoelectron Scanning Electron Microscope for Noncontact Testing of Integrated Circuits", *Appl. Phys. Lett.*, vol. 51, No. 2, 13 Jul. 1987, pp. 145–147.

Spindt et al., "The Spindt Field-Emission Cothode", *SRI International*, Technical Note 2, Nov. 1984, pp. 1–11.

"Flat Panel Displays" Brochure of *CEA Commissariat A l'Energie Atomique*, C/87 three pages.

Primary Examiner—Jack I. Berman
Attorney, Agent, or Firm—Hill, Van Santen, Steadman & Simpson

[57] ABSTRACT

In modern electron beam writers, the subject to be structured is simultaneously processed with a plurality of probes or electron beams. The apparatus of the present invention, instead of sub-dividing a single electron beam into a plurality of probes, utilizes a beam generator having a plurality of sources of electron beams, which are arranged line-like and are imaged demagnified with the assistance of a telecentric electron optical arrangement onto the subject which is to be processed or structured.

14 Claims, 2 Drawing Sheets

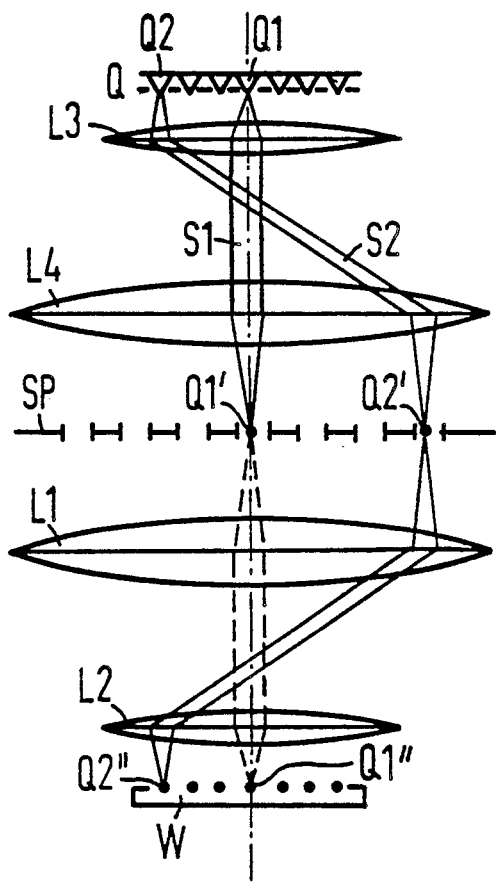
FIG 2a
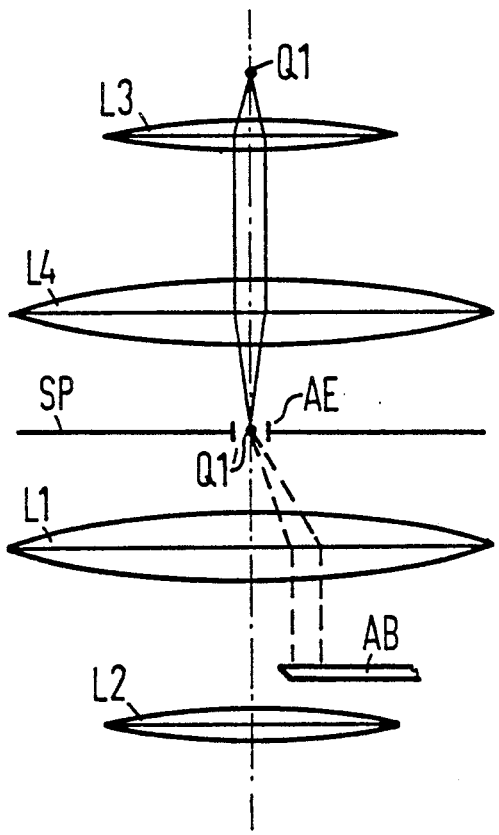
FIG 2b
FIG 3
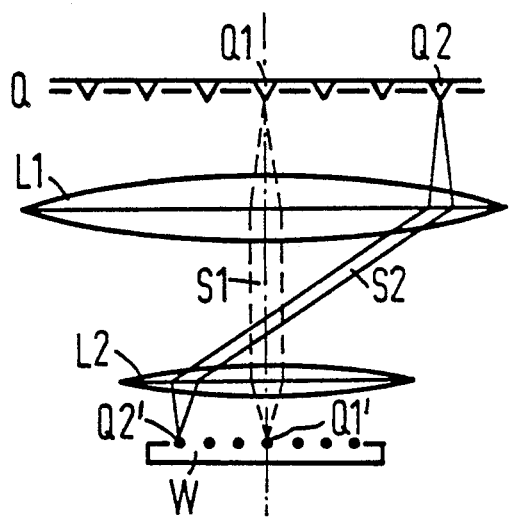

LITHOGRAPHIC APPARATUS FOR STRUCTURING A SUBJECT

BACKGROUND OF THE INVENTION

The present invention is directed to a lithography apparatus for structuring a subject or article, which apparatus produces a plurality of particle probes or particle beams.

U.S. Pat. No. 4,724,328, whose disclosure is incorporated by reference thereto, discloses a lithographic apparatus or electron beam writer which has an electron-optical column comprising a control diaphragm for generating a plurality of individual deflectable or, respectively, blankable electron probes or beams. This diaphragm is disclosed in greater detail in No. EP-No. 0 191 439 A1 and is essentially composed of a silicon wafer whose central part is constructed as a self-bearing membrane and is provided with a line-shaped arrangement of quadratic openings or apertures. An electrode system arranged in the region of the openings serves as a deflection unit.

Other lithographic apparatuses are disclosed in U.S. Pat. Nos. 4,130,761; 4,153,843; 4,409,487; and 4,524,278, and the disclosure of these U.S. Patents are incorporated by reference thereto.

In these lithographic apparatuses, the electron probes are supplied from a common source so that only a fraction of the available source current is divided into each of the particle beams. However, the probe current should be optimally high in order to increase the throughput of the structured semiconductor wafers which are being passed through the apparatus.

SUMMARY OF THE INVENTION

The object of the present invention is to provide a lithographic apparatus which has a plurality of electron probes or beams, wherein the probe current is noticeably higher than in the previously known systems. Moreover, the lithographic apparatus should have a high resolution. These objects are inventively achieved in a lithographic apparatus for structuring a subject with a plurality of particle probes, said apparatus comprising a beam generator composed of a plurality of particle sources that are arranged line-like and by a first telecentric unit for focussing the particle probes onto the subject. The apparatus can include means for individually blanking of the particle probes, which comprises a first diaphragm having a line-shaped arrangement of holes for the passage of each of the particle probes and a deflection element for individual deflecting of the particle probes onto a beam-blanking diaphragm.

In another embodiment, the plurality of particle sources are of a type in which the emission current can be switched very rapidly and, thus, the provision of a beam-blanking diaphragm and the diaphragm having a plurality of apertures with deflecting elements is not required.

A particular advantage obtainable with the invention is that the throughput of a structured semiconductor body through the apparatus is noticeably increased.

Other advantages and features of the invention will be readily apparent from the following description of the preferred embodiments, the drawings and claims.

BRIEF DESCRIPTION OF THE DRAWINGS

FIG. 1b is a side view of the device of FIG. 1a;

FIG. 2a is a front view schematically illustrating an embodiment of the lithographic apparatus according to the present invention;

FIG. 2b is a side view of the device of FIG. 2a; and

FIG. 3 is yet another embodiment of a lithographic apparatus in accordance with the present invention.

DESCRIPTION OF THE PREFERRED EMBODIMENTS

Figure 1A:
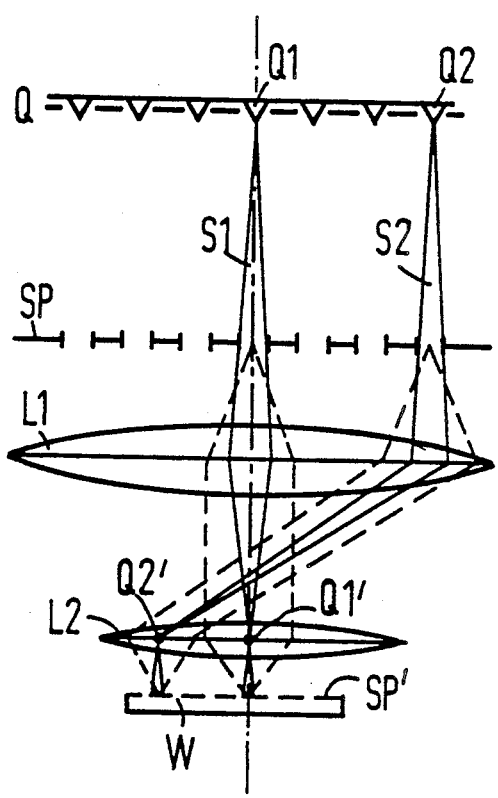
FIG. 1a is a front view schematically illustrating a lithographic apparatus in accordance with the present invention.
Figure 1B:
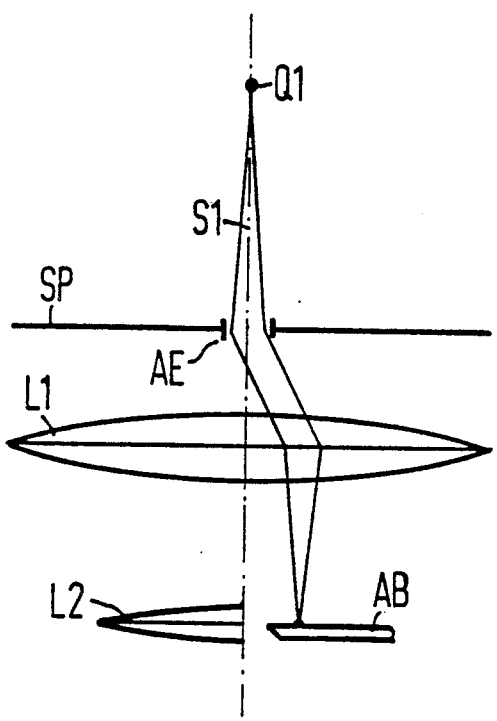

The principles of the present invention are particularly useful when incorporated in a lithographic apparatus schematically shown in FIGS. 1a and 1b. The apparatus includes a beam generator Q which is composed of a plurality of electron sources Q1, Q2, a control plate SP for shaping an blanking the electron probes or beams S1 and S2 proceeding from the sources Q1 and Q2 and an electron optics composed of a condenser lens L1 and an objective lens L2. The lenses of the electron optics or unit are conventional lenses for particle beams, such as an electron beam, and will image the quadratic or rectangular apertures of the control plate SP that are illuminated by the probes S1 and S2 onto a resist-coated semiconductor body W in a demagnified form. The distortions occurring given the imaging of the electron sources Q1 and Q1, preferably arranged along a line, is considerably reduced in the lithographic apparatus of the present invention by a telecentric beam path. It is thereby advantageous that when intermediate images, such as Q1' and Q2' of the sources Q1 and Q2 lie in the objective lens L2. The beam cross section of electron probes S1 and S2 will then become minimal inside the objective lens L2 and this will guarantee especially slight aberrations and, thus, a high resolution.

The diaphragm or control plate SP can have a structure such as that disclosed in the above-mentioned U.S. Pat. No. 4,724,328 or as disclosed in No. EP-No. 0 191 439 A1. The control plate, thus, is preferably composed of a silicon wafer that is fashioned as a self-bearing or supporting membrane in the central region and is provided with a line-shaped quadratic or rectangular apertures or holes. As illustrated in FIG. 1b, each of the holes has deflecting elements AE, particularly condenser plate pairs, allocated to it, and the signal for the deflection of the respective electron probe S1 is applied to the electrodes. The deflected probe S1 will impinge on a diaphragm AB, preferably arranged inside the objective lens L2, and is thereby blanked. In this way, arbitrary light-dark patterns can be generated with the assistance of the line-shaped array of probes.

The lithographic apparatus schematically shown in FIGS. 2a and 2b also encompasses a beam generator Q comprising a plurality of electron sources Q1, Q2 arranged along the line, a control plate SP for individual blanking of the individual electron probes S1 and S2 coming from the sources Q1 and Q2 and a telecentric unit or electron optics composed of a condenser lens L1 and of an objective lens L2 for focussing the electron probes S1 and S2 onto the semiconductor body W that is to be structured. In addition, an optics or second telecentric unit composed of a lens L3 and L4 is also provided and telecentrically images the line-shaped electron source Q onto the plane of the control plate SP. Differing from the lithographic apparatus of FIGS. 1a and 1b is the fact that the electron source Q and the control plate SP as subject as well as the images Q1' and Q2' or, respectively, SP', are spatially separated (Koehler illumination), what is referred to as a critical illumination, is realized in this exemplary embodiment. Thus, the sources Q1' and Q2' and the subject SP, as well as the images Q1" and Q2" and, respectively, SP' thereof, will respectively coincide. Each of the holes of the control plate SP, again, has deflection control elements AE allocated to it in order to potentially deflect electron probes S1 and S2 onto a blanking diaphragm AB which is arranged in the beam path under the control plate SP, as best illustrated in FIG. 2b.

In a lithographic apparatus of the present invention, each electron probe S1, S2 is supplied from a separate source Q1 or Q2. Known silicon cold cathodes, such as disclosed in an article from *J. Vac. Sci. Technol.* A5 (4), July/August 1987, pages 1544–1548; Laser-Pumped Photocathodes, such as disclosed in an article from *Applied Physics Letters.* Vol. 51, No. 2, July 1987, pages 145–147; LaB$_6$ Single-Crystal Knife-Edge Emitters, such as disclosed in U.S. Pat. No. 4,724,328; and Field Emission Cathodes, such as described in *SRI International Technical Note* 2, Nov. 8, 1984, come into consideration as electron sources for Q1 and Q2. Silicon cold cathodes and field emission cathodes, according to Spindt, whose emission current can be switched very rapidly, offer particular advantages.

A lithographic apparatus equipped with sources which require no control plate SP with the appertaining illumination optics L3 and L4, since the blanking of the electron probes S1 and S2 is undertaken by the beam generator Q itself, is illustrated in FIG. 3. As illustrated in FIG. 3 schematically, the structure of the lithographic apparatus is thereby considerable simplified because the presence of the diaphragm control plate SP is not necessary.

Although various minor modifications may be suggested by those versed in the art, it should be understood that I wish to embody within the scope of the patent granted hereon all such modifications as reasonably and properly come within the scope of my contribution to the art.

I claim:

1. A lithographic apparatus for structuring a subject with a plurality of particle probes, said apparatus comprising a beam generator composed of a plurality of sources for particle beams arranged in a line, and a first telecentric unit for focussing the particle beams to form particle probes onto the subject.

2. A lithographic apparatus according to claim 1, which includes means for individual blanking of the particle probes.

3. A lithographic apparatus according to claim 2, wherein said means for individual blanking includes a first diaphragm comprising a line-shaped arrangement of holes for passage of the particle probes, and deflecting elements for individually deflecting the particle probes onto a beam blanking diaphragm.

4. A lithographic apparatus according to claim 3, wherein the first diaphragm is arranged in the beam path above the first telecentric unit, with the holes being telecentrically imaged onto the subject.

5. A lithographic apparatus according to claim 4, wherein the first telecentric unit comprises an objective lens and intermediate images of the sources of particles are disposed on said objective lens.

6. A lithographic apparatus according to claim 5, wherein a second telecentric unit for imaging the sources of particle beams onto the plane of the first diaphragm having the openings.

7. A lithographic apparatus according to claim 4, which includes a second telecentric unit for imaging the sources of particle beams into the plane of the first diaphragm having the opening.

8. A lithographic apparatus according to claim 3, which includes a second telecentric unit for imaging the sources of particle beams into the plane of the first diaphragm having the opening.

9. A lithographic apparatus according to claim 3, wherein the beam blanking diaphragm is arranged in an objective lens of the first telecentric unit.

10. A lithographic apparatus according to claim 3, wherein the first diaphragm is arranged in the beam path above the first telecentric unit with the holes being telecentrically imaged onto the subject, said beam blanking diaphragm being arranged inside an objective lens of said first telecentric unit.

11. A lithographic arrangement according to claim 10, wherein the first telecentric unit includes a condenser lens coacting with the objective lens to focus intermediate images of the sources of the particle beams to lie in the objective lens.

12. A lithographic apparatus according to claim 11, which includes a second telecentric unit for imaging the particle sources onto the plane of the first diaphragm.

13. A lithographic apparatus according to claim 10, which includes a second telecentric unit for imaging the particle sources into the plane of the first diaphragm.

14. A lithographic apparatus according to claim 1, which includes means for individual blanking of particle beams including a first diaphragm composed of a line-shaped arrangement of openings for passage of the particle beams and having deflection elements for individually deflecting the particle probes onto a beam-blanking diaphragm, a second telecentric unit for imaging the particle source onto the plane of the first diaphragms and said beam-blanking diaphragm being arranged in an objective lens of the first telecentric unit.

* * * * *